United States Patent [19]

Bingham

[11] Patent Number: 4,547,683
[45] Date of Patent: Oct. 15, 1985

[54] HIGH SPEED CHARGE BALANCING COMPARATOR

[75] Inventor: David Bingham, San Jose, Calif.

[73] Assignee: Intersil, Inc., Cupertino, Calif.

[21] Appl. No.: 434,893

[22] Filed: Oct. 18, 1982

[51] Int. Cl.[4] ............................................. H03K 5/22
[52] U.S. Cl. .................................. 307/355; 307/350; 307/356
[58] Field of Search ............... 307/350, 355, 356, 357; 328/146, 147

[56] References Cited

U.S. PATENT DOCUMENTS

| 3,676,702 | 7/1972 | McGrogan, Jr. | 307/355 |
| 4,028,558 | 6/1977 | Heller et al. | 307/355 |
| 4,075,509 | 2/1978 | Redfern | 307/355 |
| 4,191,900 | 3/1980 | Redfern et al. | 307/355 |

Primary Examiner—John Zazworsky
Attorney, Agent, or Firm—Spensley Horn

[57] ABSTRACT

A high speed charge balancing comparator in which, without loading or affecting its input, the internal nodes and output node are maintained at voltage levels at or very close to their autozero values until a time after the commencement of the compare phase such that the polarity of the voltage at the input charge balancing node is correct. The comparator is of the type for comparing two or more voltages including a gain stage having an input node responsive to the voltages, plural internal nodes and an output node, and a plurality of switches for sequencing the voltages to the input nodes during alternate autozero and compare phases. Switches maintain the gain stage internal nodes and output node at voltage levels close to their values during the autozero phase until a time after the commencement of the compare phase.

14 Claims, 7 Drawing Figures

HIGH SPEED CHARGE BALANCING COMPARATOR

BACKGROUND OF THE INVENTION

1. Field of the Invention

The present invention relates to a high speed charge balancing comparator and, more particularly, to an improved charge balancing comparator having a substantially reduced response time whereby the speed of operation of the comparator is greatly improved.

2. Description of the Prior Art

Charge balancing comparators have been known and used for several years. The charge balancing comparator operates on the principle that the net charge onto its input nodes from two or more sources will cause either a positive or a negative voltage swing at the input charge balancing node. The state of the output of the comparator will depend on the polarity of the change of the voltage at this node. The comparator does not respond to the absolute value of the voltage at this node. At a suitable time, the output node is interrogated to see if it has swung in either a positive or a negative direction and this information is stored elsewhere.

This type of comparator is becoming increasingly popular in successive approximation analog-to-digital (A/D) converters using MOS or CMOS semiconductor integrated circuit technologies (although its use is not limited to these applications). One of the principle goals of any A/D converter is usually to minimize its time for making a conversion and most converters are ultimately limited in their high speed operation by the speed of their comparators.

Previous designs of comparators have been limited in speed of response due to the settling time of the input charge balancing node. The initial incorrect voltage on the input charge balancing node causes the output of the comparator, together with its internal nodes, to be disturbed significantly such that when the input charge balancing node does finally settle to its correct value, the comparator must first correct the internal node voltages, resulting in a long total response time at its output.

A better understanding of this problem can be derived with reference to FIG. 1, which shows a schematic diagram of a typical charge balancing comparator, generally designated 10, and to FIG. 2, which shows a series of waveforms as a function of time which are useful in understanding the operation of comparator 10. For purposes of discussion, comparator 10 utilizes an operational amplifier 11 as the gain element. However, in practice, because of speed limitations, other configurations will almost always be used. Switches $S_1$, ... $S_N$ apply voltages $V_1$, ... $V_N$, respectively, via capacitors $C_1$, ... $C_N$, respectively, to input node A of operational amplifier 11. Similarly, switches $S_{11}$, ... $S_{NN}$ apply voltages $V_{11}$, ... $V_{NN}$, respectively, via capacitors $C_1$, ... $C_N$, respectively, to input node A. An autozero switch $S_{AZ}$ connects the inverting input of amplifier 11 to its output. Switches $S_1$, ... $S_N$ and $S_{AZ}$ are controlled by a timing signal shown as waveform 12 in FIG. 2 and switches $S_{11}$, ... $S_{NN}$ are controlled by a timing signal shown as waveform 13 in FIG. 2. Waveform 14 shown in FIG. 2 is the theoretical output $V_{OUT}$ of operational amplifier 11.

During the autozero phase, switches $S_1$, ... $S_N$ and $S_{AZ}$ will be closed and switches $S_{11}$, ... $S_{NN}$ will be open. During this phase, switch $S_{AZ}$ connects the inverting input of amplifier 11 to its output, thereby putting amplifier 11 into a unity gain configuration. If amplifier 11 is perfect, the voltage $V_{OUT}$ will be at ground. In practice, because of finite errors such as input offset voltages, $V_{OUT}$ will be offset from ground potential up to a few millivolts. For the sake of simplicity, it will be assumed that amplifier 11 has no errors and that there are only two input pairs of voltages to be compared, $V_1$ and $V_{11}$ plus $V_2$ and $V_{22}$ (N=2 and NN=22). During the autozero phase, capacitors $C_1$ and $C_2$ will be charged to voltages $V_1$ and $V_2$, respectively.

During the compare phase, switches $S_{AZ}$, $S_1$ and $S_2$ are opened and switches $S_{11}$ and $S_{22}$ are closed. The voltage $V_A$ at the input node A to amplifier 11 will eventually assume a voltage $V_A$:

$$V_A = \frac{C_1(V_{11} - V_1) + C_2(V_{22} - V_2)}{(C_1 + C_2)} \quad (1)$$

It can be seen that $V_A$ can have any real positive or negative value depending on the magnitude of $C_1$ and $C_2$ and the magnitudes and polarities of $(V_{11}-V_1)$ and $(V_{22}-V_2)$.

The output voltage $V_{OUT}$ will respond after a finite time to the new value of $V_A$. For example, if voltage $V_A$ has acquired a negative shift of value compared to that during the autozero phase, $V_{OUT}$ will swing by a positive amount as shown as waveform 14 in FIG. 2. At the end of this phase, $V_{OUT}$ is detected and stored elsewhere (on a capacitor or latch) and the cycle repeated. Each complete cycle is defined as the analog-to-digital conversion time and it is usually desired that this time be as short as possible.

Problems arise in the use of comparator 10 when the mechanical switches shown in FIG. 1 are replaced by MOS switches or the like having finite values of series resistance and when the values in the numerator of equation (1) are different by a very small value to those in the denominator, i.e.:

$$1.005 > \frac{C_1(V_{11} - V_1)}{C_2(V_{22} - V_2)} > 0.995$$

The problem manifests itself in an initially inaccurate high value of voltage $V_A$ at node A at the beginning of the compare cycle. Although the voltage $V_A$ will finally settle to its correct value, this initial voltage can make the gain element (operational amplifier 11 in FIG. 1) swing its output and internal node voltages to incorrect values such that when the input voltage $V_A$ has settled down to near its correct value and final polarity, the gain element requires significantly more time to correct its output voltage $V_{OUT}$ and its internal node voltages compared to the case where this initial transient of input voltage had not occurred.

To demonstrate this initial transient, reference should be had to FIG. 3, wherein the input of comparator 10 is modified by eliminating switches $S_{11}$ and $S_{22}$ and substituting therefore single switches $S_1$ and $S_2$ with their respective series resistors $R_1$ and $R_2$. Additionally, for the sake of simplicity, switch $S_{AZ}$ is shown connecting node A to ground during the autozero phase. Switches $S_1$ and $S_2$ also connect capacitors $C_1$ and $C_2$, respectively, to voltages $V_1$ and $V_2$, respectively, during the autozero phase.

The voltage at node A from the beginning of the compare phase is defined by the equation:

$$V_A = V_{A(FINAL)} + [V_{A(INITIAL)} - V_{A(FINAL)}]e^{-A/t}, \quad (2)$$

where t=time, $$A = (R_1 + R_2)\frac{C_1 C_2}{(C_1 + C_2)}, \quad (3)$$

$$V_{A(INITIAL)} = \frac{R_2(V_{11} - V_1) + R_1(V_{22} - V_2)}{(R_1 + R_2)}, \text{ and} \quad (4)$$

$$V_{A(FINAL)} = \frac{C_1(V_{11} - V_1) + C_2(V_{22} - V_2)}{(C_1 + C_2)}. \quad (1)$$

It should be noted that the initial value of $V_A$ is solely dependent upon the input differential voltages $(V_{11}-V_1)$ and $(V_{22}-V_2)$ and the equivalent resistance of $R_1$ and $R_2$, that the final value of $V_A$ is solely dependent on the same differential voltages and capacitors $C_1$ and $C_2$, and that the time constant for the voltage $V_A$ to change from $V_{A(INITIAL)}$ towards $V_{A(FINAL)}$ is dependent on the equivalent RC product of the two resistors $R_1$ and $R_2$ in series and the two capacitors $C_1$ and $C_2$ in series.

To demonstrate this situation, consider a practical case for an 8-bit A/D converter. The reference voltage $(V_{11}-V_1)$ is $-2.500$ volts and the full scale input voltage $(V_{22}-V_2)$ less one least significant bit is $(5.000-5.000/256)$ volts or approximately 4.980 volts. In this example, capacitor $C_1$ has a value of 10 picofarads, capacitor $C_2$ has a value of 5 picofarads and the equivalent series resistances $R_1$ and $R_2$ of the MOS switches are 2000 ohms each. Inserting these values in equations (5) and (1):

$$V_{A(INITIAL)} = \frac{2000\,(-2.500) + 2000\,(4.980)}{4000}$$

$$= 1.240 \text{ VOLTS}$$

$$V_{A(FINAL)} = \frac{10^{-11}\,(-2.500) + 5 \times 10^{-12}\,(4.980)}{1.5 \times 10^{-11}}$$

$$= -0.0067 \text{ VOLT.}$$

The time constant TC for $V_A$ is defined by:

$$TC = (R_1 + R_2)\frac{C_1 C_2}{C_1 + C_2} \quad (5)$$

$$= (2000 + 2000)\frac{10^{-11} \times 5 \times 10^{-12}}{10^{-11} + 5 \times 10^{-12}}$$

$$= 3 \times 10^{-9} \text{ SECOND.}$$

Between four and five time constants (approximately 14 nanoseconds) are required before voltage $V_A$ assumes approximately its correct value.

This example is shown in FIG. 4 where voltage $V_A$ is plotted as a function of time (curve 15). The ratio of the initial magnitude of voltage $V_A$ is almost 200 times that of its final value. More importantly, its initial polarity is reversed from its final condition. As the example shows, the initial input transient can be of such a high magnitude and sign that it can cause the gain element of the comparator to slam its output into an incorrect state and, often just as undesirable, cause its internal nodes to assume grossly incorrect voltage values such that when the input voltage $V_A$ assumes its correct polarity, at time $t_1$ in FIG. 4, and then its small terminal magnitude, the internal node and output voltages have to be initially corrected to their autozero values and then to their final values. This produces a delay at the output of the comparator which is usually twice to many times that which would occur if no input transient had been allowed and the input voltage $V_A$ had been connected to the input of the comparator only after the time $t_1$. Since the speed or response time of the comparator is the limiting factor for A/D converters and other systems using comparators, it is highly desirable to eliminate or reduce the effect of input voltage transients for this family of charge balancing comparators.

SUMMARY OF THE INVENTION

According to the present invention, these problems are solved by the provision of a new type of comparator in which, without loading or affecting its input, the internal nodes and output node are maintained at voltage levels at or very close to their autozero values until a time after the commencement of the compare phase such that the polarity of the input voltage $V_A$ is correct. This eliminates input transients as shown in FIG. 4 and eliminates the necessity for correcting the internal node and output voltages. It also eliminates delays at the output of the comparator of the type discussed hereinbefore. The result is a substantially increased speed of response for analog-to-digital converters.

Briefly, in a comparator of the type for comparing two or more voltages including a gain stage having an input node responsive to the voltages, plural internal nodes and an output node, and a plurality of switches for sequencing the voltages to the input nodes during alternate autozero and compare phases of a comparator cycle, there is disclosed an improvement comprising switch means for maintaining the gain stage internal nodes and output node at voltage levels close to their values during the autozero phase until a time after the commencement of the compare phase.

OBJECTS, FEATURES AND ADVANTAGES

It is therefore the object of the present invention to solve the problems resulting from input voltage transients at the charge balancing node in charge balancing comparators. It is a feature of the present invention to solve these problems by maintaining the comparator's gain stage internal nodes and output node at voltage levels close to their values during an autozero phase until a time after the commencement of a compare phase. An advantage to be derived is a comparator having a significantly increased speed. Another advantage is the elimination of the effect of initial input voltage transients. Still another advantage is the ability to prevent internal nodes from assuming grossly incorrect voltages.

Still other objects, features, and attendant advantages of the present invention will become apparent to those skilled in the art from a reading of the following detailed description of the preferred embodiment constructed in accordance therewith, taken in conjuction with the accompanying drawings wherein like numerals designate like or corresponding parts in the several figures and wherein:

DESCRIPTION OF THE PREFERRED EMBODIMENT

Figure 5:
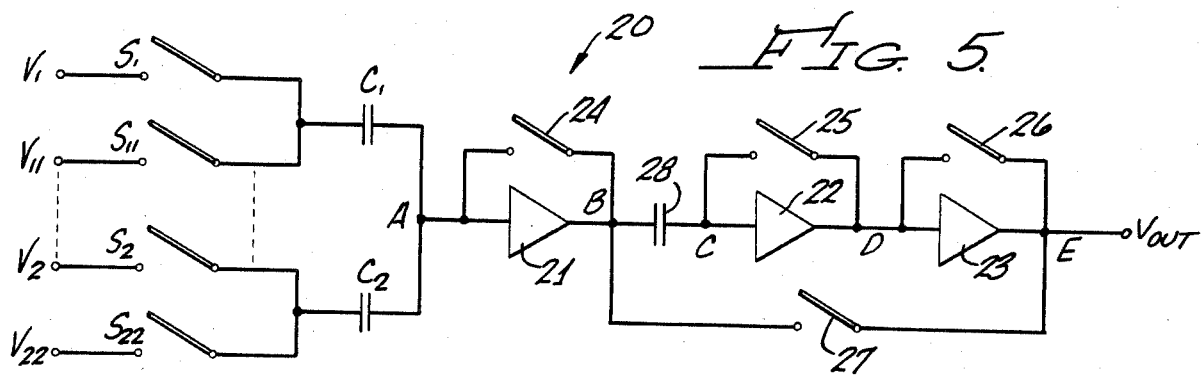
FIG. 5 is a schematic diagram of a charge balancing comparator constructed in accordance with the teachings of the present invention.
Figure 6:
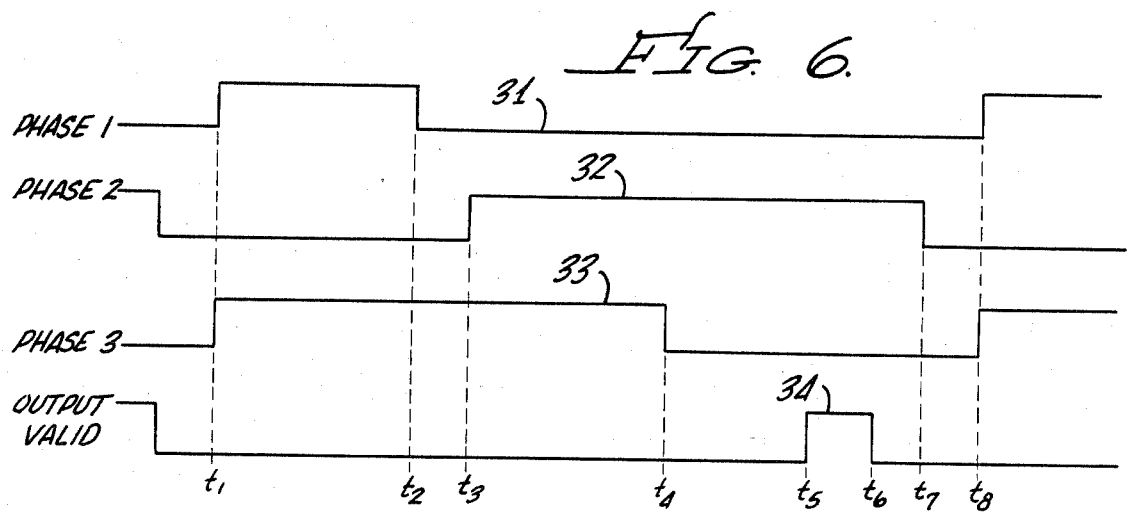
FIG. 6 is a timing diagram for the comparator of FIG. 5.

Referring now to FIGS. 5 and 6, according to the present invention, there is provided a new type of charge balancing comparator, generally designated 20, in which, without loading or affecting its input, the internal nodes and output node are maintained at voltage levels at or very close to their autozero values until a time after commencement of the compare phase such that the polarity of the input voltage $V_A$ is correct. The principle of this delayed response comparator can be applied to almost any comparator configuration. However, the particular example to be described is extremely simple to implement in any MOS semiconductor technology, although not limited to MOS technologies.

Figure 1:
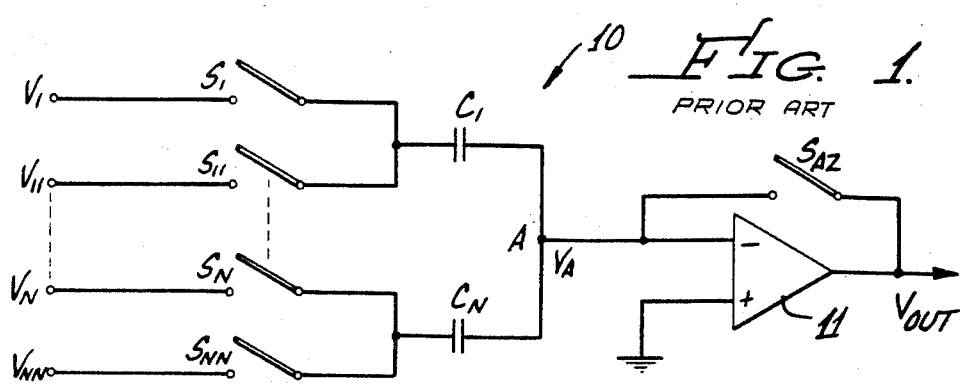
FIG. 1 is a schematic diagram of a conventional charge balancing comparator.
Figure 2:
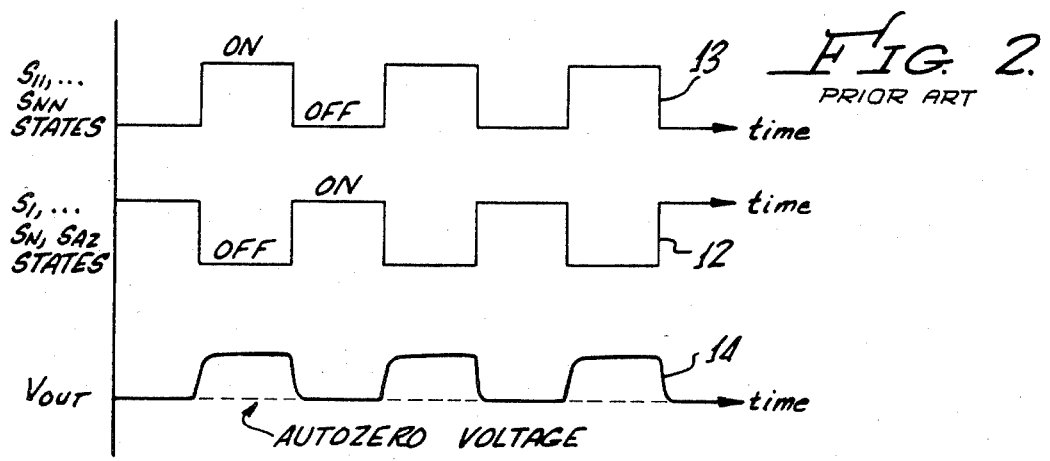
FIG. 2 is a series of waveforms useful in explaining the operation of the circuit of FIG. 1.
Figure 3:
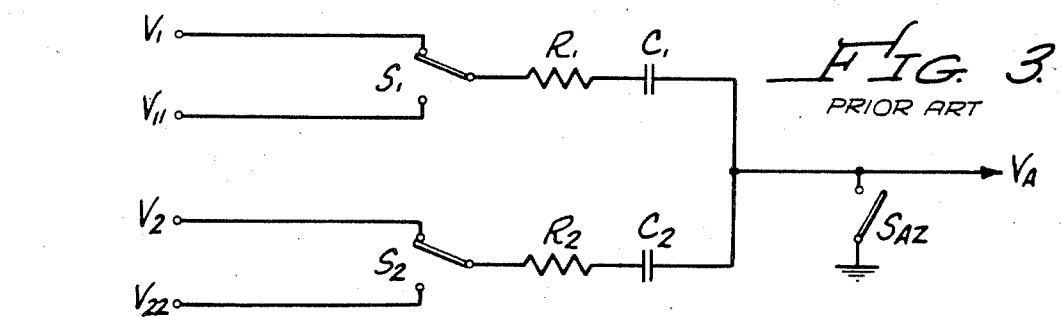
FIG. 3 is a schematic diagram of a modified input circuit for the comparator of FIG. 1.
Figure 4:
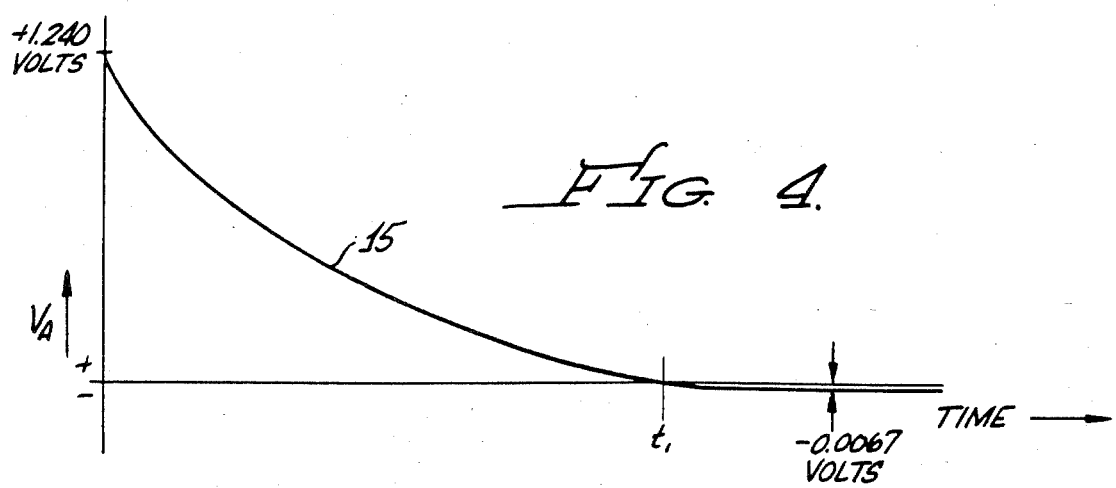
FIG. 4 is a plot of input voltage $V_A$ transient as a function of time for the comparator of FIG. 1.

FIG. 5 is a schematic diagram of comparator 20 in which the input to the gain element is the same as that described hereinbefore with regard to comparator 10 of FIG. 1. The gain element of comparator 10 uses a ratioed trio of three gain stages 21, 22 and 23. Gain stage 21 is AC coupled to gain stage 22 by means of a capacitor 28 whereas DC coupling is used between stages 22 and 23. Each stage 21, 22 and 23 has a switch 24, 25 and 26, respectively, connected between its input and its output. An additional switch 27 is connected between the output of stage 23 and the output of stage 21. In a typical embodiment, the voltage gain of each stage is approximately 40 so that the total voltage gain from point A (input to stage 21) to point E (output of stage 23) is 64,000.

Gain stages 21-23 consist of simple transconductance amplifiers and the internal components of each are ratioed to produce similar output voltages during the autozero phase. Stage 23 is ratioed with respect to stages 21 and 22 so that it has a much higher transconductance and output current capability. The switches all have finite series resistances and switches 26 and 27 have low series resistances such that the combined output conductance of stage 23 and the equivalent conductances (reciprocal of series resistance) of switches 26 and 27 with such switches closed is much higher than the output conductance of either stage 21 or 22 irrespective of the input voltages on stages 21 and 22.

Referring now to the timing diagrams of FIG. 6, there is shown four timing signals 31, 32, 33, and 34, denoted phase 1, phase 2, and phase 3, and "output valid", respectively, for sequencing the operation of switches $S_1$, $S_2$, $S_{11}$, $S_{22}$, and 24-27. The phase 1 timing signal controls switches $S_1$, $S_2$, 24 and 25, the phase 2 timing signal controls switches $S_{11}$ and $S_{22}$ and the phase 3 timing signal controls switches 26 and 27. The "output valid" timing signal is used to interrogate $V_{OUT}$ at the appropriate time in the comparator cycle.

At time $t_1$, which marks the start of the autozero phase, switches $S_{11}$ and $S_{22}$ are open, switches $S_1$, $S_2$, 24, 25, 26 and 27 are all closed and the nodes A, B, C, D and E are held at approximately the same voltage (the autozero voltage). At time $t_2$, which marks the end of the autozero phase, switches $S_1$, $S_2$, 24 and 25 are opened. A short time later, at time $t_3$, switches $S_{11}$ and $S_{22}$ are closed (establishing a break before make sequence with switches $S_1$, $S_2$, $S_{11}$ and $S_{22}$). At this time, the start of the compare phase, a transient voltage of incorrect polarity can occur at node A if the polarities and the phases of the input voltages $(V_1-V_{11})$ and $(V_2-V_{22})$ are chosen in a similar manner to the example previously described. However, stage 23 maintains minimal voltage excursions on nodes B, C and D, the gain element internal nodes, due to its high output conductance.

A time $t_4$ is chosen so that the input transient voltage on node A has finished. Accordingly, at time $t_4$, switches 26 and 27 are opened and comparator 20 is allowed to respond to the new voltage $V_A$ on node A. Since the voltages on nodes B, C, D and E are close to their autozero voltages at time $t_4$, the output node E will respond in the shortest time to the voltage $V_A$. If the polarity of $V_A$ is negative with respect to the autozero voltage, node E will swing quickly in a positive direction. Similarly, if the polarity of $V_A$ is positive with respect to the autozero voltage, node E will swing quickly in a negative direction. The time from $t_4$ to time $t_5$ allows the nodes B, C, D and E to slew sufficiently so that the output voltage $V_{OUT}$ at node E is unambiguous. During the time slot from $t_5$ to time $t_6$, a timing signal 34 interrogates node E to see if it has swung in either a positive or negative direction and this information is stored elsewhere. The time from $t_6$ to time $t_8$ may then be used to provide a break before make for the switching sequence. Thus, at time $t_7$, switches $S_{11}$ and $S_{22}$ open. The cycle starts over again at time $t_8$.

Figure 7:
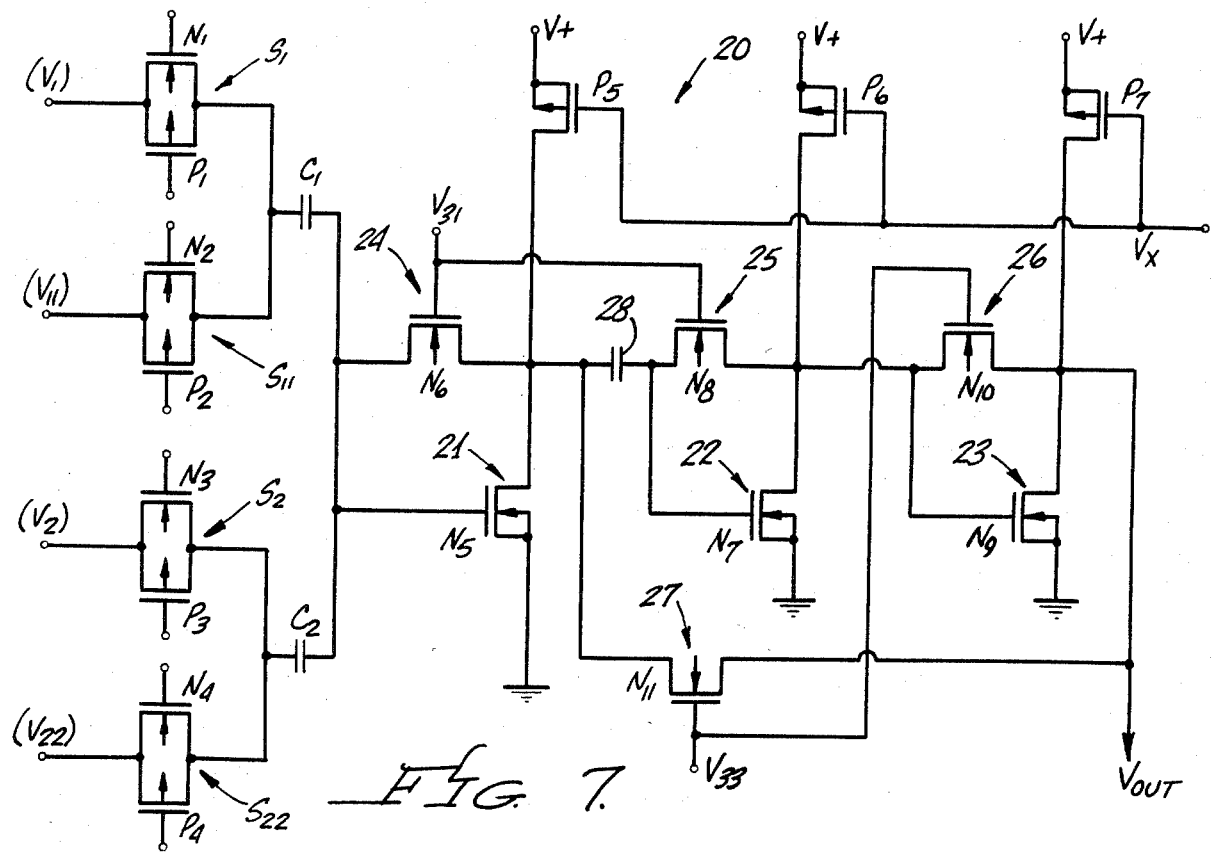
FIG. 7 is a circuit diagram of a practical implementation of the comparator of FIG. 5.

Referring now to FIG. 7, there is shown a practical implementation of comparator 20. This design utilizes CMOS technology for implementation, but the invention is obviously not limited to this technology. In the implementation of FIG. 7, each gain stage 21, 22 and 23 consists of an n-channel MOS transistor common source amplifier $N_5$, $N_7$ and $N_9$, respectively, with a current source p-channel transistor load $P_5$, $P_6$ and $P_7$, respectively. The sizes (channel width to channel length) of transistors $P_5$, $P_6$ and $P_7$ should be ratioed so that $P_7$ is significantly larger than either $P_5$ or $P_6$. Similarly, transistor $N_9$ should be ratioed to transistors $N_5$ and $N_7$ in exactly the same ratio as for transistors $P_7$, $P_5$ and $P_6$. The voltage $V_X$ provides a forward biasing gate-to-source voltage for transistors $P_5$, $P_6$ and $P_7$ so that these transistors act as ratioed current sources; the larger the transistor, the higher the value of the equivalent current source.

Switches 24-27 consist of n-channel transistors $N_6$, $N_8$, $N_{10}$ and $N_{11}$, respectively. Transistors $N_6$ and $N_8$ receiving a voltage $V_{31}$, shown as timing signal 31 in FIG. 6 and transistors $N_{10}$ and $N_{11}$ receive a voltage $V_{33}$, shown as timing signal 33 in FIG. 6.

Switch $S_1$ is composed of transistors $P_1$ and $N_1$ requiring complementary signals on each gate. Similarly, switch $S_{11}$ is composed of transistors $N_2$ and $P_2$, switch $S_2$ is composed of transistors $N_3$ and $P_3$, and switch $S_{22}$ is composed of transistors $N_4$ and $P_4$. For turn-on, the gate of the n-channel transistor should be connected to $V+$ and the gate of the p-channel transistor should be connected to ground. To open or turn off this complementary switch, the gate voltages should be reversed. It may be desirable to use complementary input switches as shown so that the input common mode range (using gate control voltages of either V+ or ground) can be V+ and ground. For other ranges, these complementary switches may be replaced by single polarity MOS transistors. It should also be noted that where not designated, the substrates of p-channel transistors are connected to V+ and the substrates of n-channel transistors are connected to ground.

The implementation of circuit 20 shown in FIG. 7 uses the same timing sequence as shown in FIG. 6. The system can autozero correctly and resolve to 8-bit accuracy a 5 volt signal compared to a 2.5 volt reference in a total time of 0.5 microsecond.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. A comparator for comparing two or more input voltages comprising:
   an amplifier having an input node, at least one internal node, and an output node;
   means for operating said amplifier in alternate autozero and compare phases in which said input, internal and output nodes are driven to respective autozero voltages during said autozero phase, and at least two input voltages are compared at said input node during said compare phase;
   switch means having an open state and a closed state for coupling said output node to said internal node when closed; and
   means for maintaining said switch means closed during said autozero phase and until a predetermined time after the commencement of said compare phase to maintain said amplifier internal node and output node at voltage levels close to their autozero values during said autozero phase and until a predetermined time after the commencement of said compare phase.

2. A comparator according to claim 1, wherein said predetermined time is sufficient to allow transient voltages at said input node occurring upon commencement of said compare phase to terminate.

3. A comparator according to claim 1, wherein said amplifier includes plural internal nodes.

4. A comparator according to claim 3, wherein said amplifier comprises:
   first, second and third cascaded gain stages, each stage having an input and an output and said internal node is the output of said first gain stage.

5. A comparator according to claim 4, wherein said output of said first gain stage is AC coupled to the input of said second gain stage and the output of said second gain stage is DC coupled to the input of said third gain stage.

6. A comparator according to claim 4 or 5, further comprising:
   second, third and fourth switch means for coupling the input to the output of said first, second and third gain stages, respectively.

7. A comparator according to claim 6 further comprising means for opening said second and third switch means at the commencement of said compare phase and for opening said fourth switch means at said predetermined time after the commencement of said compare phase.

8. A comparator according to claim 4, wherein said gain stages comprise:
   transconductance amplifiers, the internal components of said amplifiers being ratioed to produce similar output voltages during said autozero phase.

9. A comparator according to claim 8, wherein said third gain stage is ratioed with respect to said first and second gain stages so as to have a higher transconductance and output capability.

10. A comparator according to claim 1, wherein said amplifier comprises:
    plural gain stages.

11. A comparator according to claim 10, wherein said gain stages comprise:
    transconductance amplifiers, the internal components of said amplifiers being ratioed to produce similar output voltages during said autozero phase.

12. A comparator according to claim 11, wherein the last of said gain stages is ratioed with respect to the other gain stages so as to have a higher transconductance and output capability.

13. A comparator for comparing two or more input voltages comprising:
    an amplifier comprising two field-effect transistor gain stages, said amplifier having an input node coupled to the gate of the first transistor gain stage, an internal node coupled to the output of the first transistor stage and the gate of the second transistor stage and an output node coupled to the output of the second transistor gain stage;
    means for operating said amplifier in alternate autozero and compare phases in which said input, internal and output nodes are driven to respective autozero voltages during said autozero phase, and at least two input voltages are compared at said input node during said compare phase; and
    means for maintaining said amplifier internal node and output node at voltage levels close to their respective autozero values during said autozero phase and until a predetermined time after the commencement of said compare phase so that any voltage transient at the input node during the predetermined time is suppressed at the internal node.

14. A comparator for comparing two or more input voltages comprising:
    an amplifier comprising three cascaded gain stages, each gain stage having an input and an output, said amplifier having an input node coupled to the input of the first gain stage, an internal node coupled to the output of the first gain stage and the input of the second gain stage, and an output node coupled to the output of the third gain stage;
    at least two input capacitors coupled to the input node at one end, the other end of each capacitor having a plurality of transistor switches associated therewith for sequentially coupling the associated capacitor to a plurality of input voltages;
    a first feedback transistor switch for coupling the output to the input of the first gain stage during an autozero cycle;

a second feedback transistor switch for coupling the output to the input of the second gain stage during the autozero cycle; and a third feedback transistor switch for coupling the output to the input of the third gain stage;

a fourth feedback transistor switch for coupling the amplifier output node to the amplifier internal node during the autozero cycle; and means for maintaining the third and fourth transistor switches in a closed state for an interval of time after the termination of the autozero phase to allow substantial settling voltage transients at the amplifier input node before the third and fourth transistor switches are opened.

* * * * *